United States Patent
Tashiro et al.

(10) Patent No.: US 7,151,004 B2
(45) Date of Patent: Dec. 19, 2006

(54) METHOD OF FABRICATING SEMICONDUCTOR LASER

(75) Inventors: Yoshihisa Tashiro, Tokyo (JP); Zempei Kawazu, Tokyo (JP); Harumi Nishiguchi, Tokyo (JP); Tetsuya Yagi, Tokyo (JP); Akihiro Shima, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 227 days.

(21) Appl. No.: 10/790,199

(22) Filed: Mar. 2, 2004

(65) Prior Publication Data

US 2004/0165633 A1 Aug. 26, 2004

Related U.S. Application Data

(62) Division of application No. 09/879,166, filed on Jun. 13, 2001, now abandoned.

(30) Foreign Application Priority Data

Dec. 14, 2000 (JP) .............................. 2000-380050

(51) Int. Cl.
*H01L 31/26* (2006.01)
(52) U.S. Cl. .................... 438/16; 438/36; 257/E21.521
(58) Field of Classification Search .................. 438/16
See application file for complete search history.

(56) References Cited

U.S. PATENT DOCUMENTS

| | | | |
|---|---|---|---|
| 4,809,289 A | 2/1989 | Goto et al. | |
| 5,469,457 A | 11/1995 | Nagai et al. | |
| 5,494,850 A * | 2/1996 | Cho et al. | 117/3 |
| 5,577,063 A | 11/1996 | Nagai et al. | |
| 5,617,957 A * | 4/1997 | Yoshida et al. | 209/571 |
| 5,703,894 A | 12/1997 | Valster et al. | |
| 5,728,623 A * | 3/1998 | Mori | 438/455 |
| 5,781,577 A | 7/1998 | Nagai et al. | |
| 5,825,797 A | 10/1998 | Nagai | |
| 6,396,864 B1 * | 5/2002 | O'Brien et al. | 372/49.01 |
| 2002/0020341 A1 * | 2/2002 | Marchand et al. | 117/84 |

OTHER PUBLICATIONS

Matsumoto et al.; "High Power Laser Diode with Window Grown on Facets" *Sharp Gihou*, vol. 50, pp. 33-36, (Sep. 1991).

(Continued)

*Primary Examiner*—B. William Baumeister
*Assistant Examiner*—Matthew L. Reames
(74) *Attorney, Agent, or Firm*—Leydig, Voit & Mayer, Ltd.

(57) ABSTRACT

In fabricating a semiconductor laser producing light with a wavelength of 770 to 810 nm, impurities are introduced into an MQW active layer near a light emitting facet of the laser to form a disordered region constituting a window layer. Pump light is applied to the window layer to generate photoluminescence whose wavelength $\lambda\, dpl$ (nm) is measured. A blue shift amount $\lambda\, bl$ (nm) is defined as the difference between the wavelength $\lambda\, apl$ (nm) of photoluminescence generated by application of pump light to the active layer on the one hand, and the wavelength $\lambda\, dpl$ (nm) of photoluminescence from the window layer under pump light irradiation on the other hand. The blue shift amount $\lambda\, bl$ is referenced during the fabrication process in order to predict catastrophic optical damage levels of semiconductor lasers.

2 Claims, 9 Drawing Sheets

OTHER PUBLICATIONS

Nagai et al., "Characteristics of Laser Diode with a Partially Intermixed GaAs-AlGaAs Quantum Well", *IEEE J. of Quantum Electronics,V* vol. 31, No. 8, pp. 1364-1370, (Aug. 1995).

Nagai et al., "Characteristics of the Laser Diode with Partially Intermixed GaAs/AlGaAs Quantum Well", *Semiconductor Laser Conf., 1992, Conf. Digest. 13th, IEEE Int'l*, pp. 232-233.

* cited by examiner

METHOD OF FABRICATING SEMICONDUCTOR LASER

BACKGROUND OF THE INVENTION

1. Field of the Invention

The present invention relates to a semiconductor laser device and a method for fabricating such a device. More particularly, the invention relates to a semiconductor laser device for use in optical data processing and to a method for fabricating that device.

2. Description of the Related Art

A trend in recent years has been for CD-R/RW drives to run at increasingly higher speeds than before. That trend has entailed a growing need for semiconductor lasers producing light in the 780 nm band, which are used by the high-speed drives, to provide greater output. A major constraint on getting the semiconductor laser to be more highly powered is a degradation of its light emitting facet. This type of degradation, called COD (catastrophic optical damage) degradation, stems from defects in the vicinity of the light emitting facet causing optical absorption.

One way to reduce the COD degradation at the light emitting facet is by having a window structure laser with a wide band gap region, i.e., a region where no light absorption takes place, formed on the light emitting facet. One such solution is described illustratively in the Sharp Technical Report (a Japanese publication), No. 50, September 1991, pp. 33–36.

Figure 14:
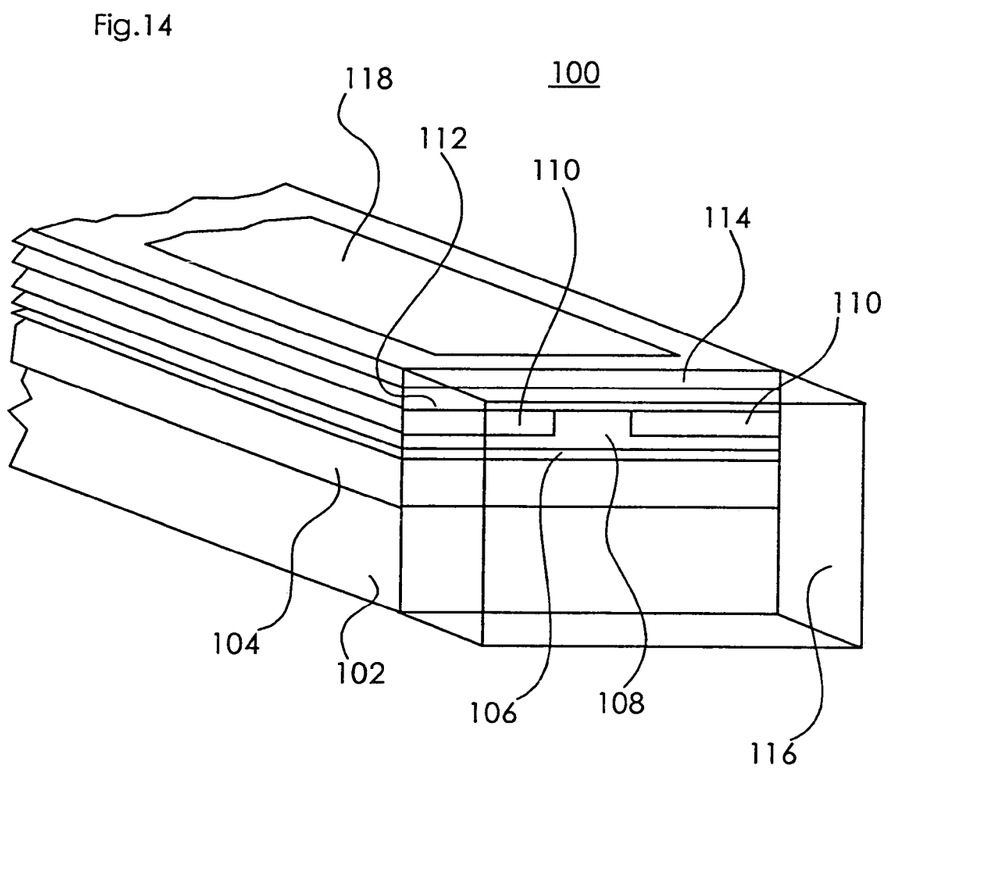
FIG. 14 is a partial perspective view of a semiconductor laser having a conventional window structure.
Figure 15A:
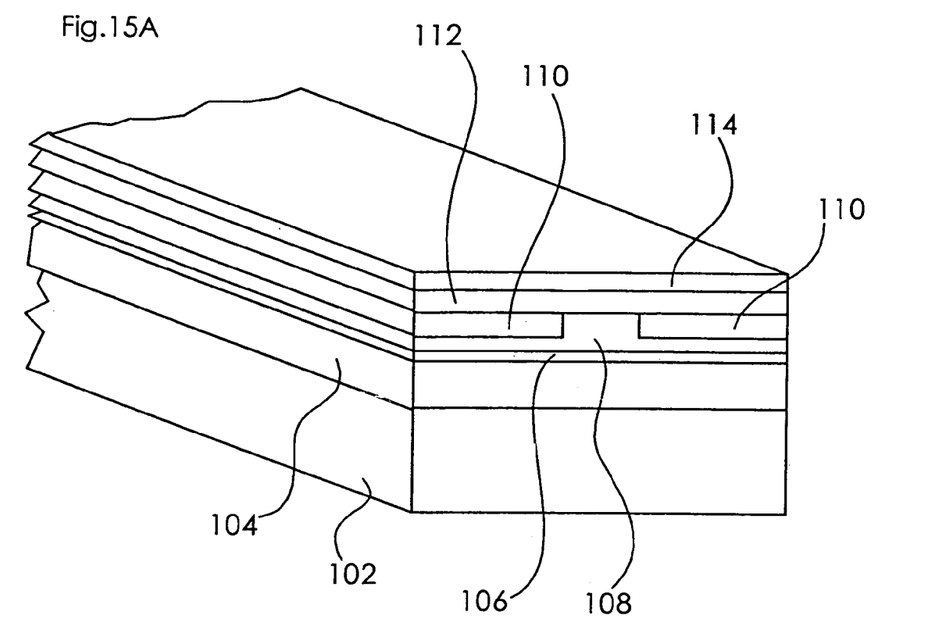
FIGS. 15A and 15B are partial perspective views showing steps of a method for fabricating the semiconductor laser with the conventional window structure.
Figure 15B:
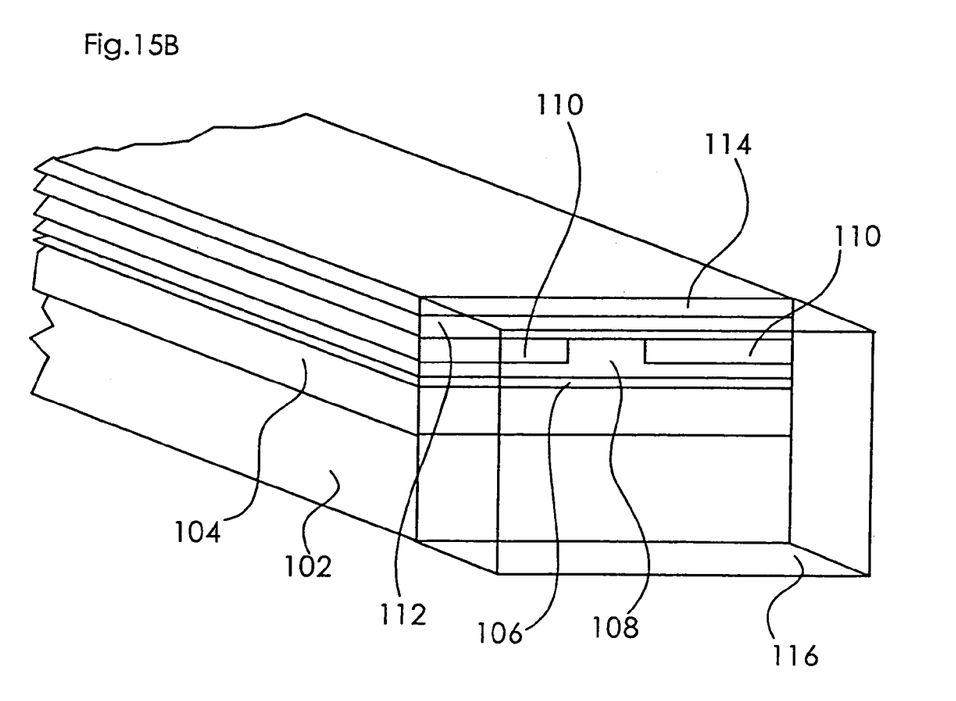

FIG. 14 is a partial perspective view of a semiconductor laser having a conventional window structure. FIGS. 15A and 15B are partial perspective views showing steps of a method for fabricating the semiconductor laser with the conventional window structure.

In FIG. 14, reference numeral 100 represents a semiconductor laser, and 102 denotes an n-type GaAs substrate (in the description that follows, the symbol "n-" stands for the n-conductivity type, "p-" for the p-conductivity type, and "i-" for an intrinsic semiconductor). Reference numeral 104 stands for an n-$Al_{0.5}Ga_{0.5}As$ lower clad layer; 106 for an MQW active layer having an i-$Al_{0.1}Ga_{0.5}As$ well layer; 108 for a p-$Al_{0.5}Ga_{0.5}As$ first upper clad layer; 110 for an n-AlGaAs current blocking layer; 112 for a p-AlGaAs second upper clad layer; 114 for a p-GaAs contact layer; 116 for an i-$Al_{0.5}Ga_{0.5}As$ window layer with a band gap greater than that of the MQW active layer 106; and 118 for an electrode.

The conventional method for fabricating the semiconductor laser sketched above will now be outlined. In FIG. 15A, the lower clad layer 104, MQW active layer 106 and first upper clad layer 108 are epitaxially grown on the n-GaAs substrate 102. With a ridge produced by etching, the current blocking layer 110 is selectively grown. The second upper clad layer 112 and the contact layer 114 are then formed over the ridge and current blocking layer 110. The result of these steps is shown in FIG. 15A.

Thereafter, the n-GaAs substrate 102 is reduced in thickness at the back surface to a thickness of about 100 μm. Laser facets are formed by cleaving and the window layer 116 is formed by crystalline growth. The result of this process is illustrated in FIG. 15B. Forming the electrode 118 on the structure completes the semiconductor laser of FIG. 14.

On the conventional semiconductor laser 100 constituted as outlined above, the window layer 116 is formed by crystalline growth on the cleaved surface following cleavage of the laser facets. This conventional process tends to be complicated because the window layer 116 and electrode 118 need to be formed after the cleaving step.

Japanese Patent Publication No. 2827919, which is equivalent to U.S. Pat. No. 4,809,289, discloses a method for forming a window structure. The method includes forming a first upper clad layer on an MQW active layer, to be topped subsequently with an ion implantation mask pattern, and forming the window structure by disordering the MQW active layer in the vicinity of the laser facet by means of impurity implantation at a low energy level. According to the disclosed method, the degree of disordering must be controlled precisely, otherwise the window effect will not occur, resulting in a semiconductor laser degrading during use.

SUMMARY OF THE INVENTION

The present invention has been made to overcome the above-described drawbacks and disadvantages of the related art. Therefore, it is an object of the present invention to provide a highly reliable semiconductor laser device offering a significantly consistent immunity to COD degradation.

According to one aspect of the invention, there is provided a semiconductor laser device with an oscillation wavelength of 770 to 810 nm, comprising: a semiconductor substrate of a first conductivity type; a first clad layer of the first conductivity type disposed on the semiconductor substrate; an active layer of a quantum well structure disposed on the first clad layer; a first second-clad layer of a second conductivity type disposed on the active layer; a disordered region formed near a laser resonator facet by introducing impurities from a surface of the first second-clad layer into the layers including the active layer on the semiconductor substrate; and an optical waveguide including a second second-clad layer of the second conductivity type disposed on the surface of the first second-clad layer in a manner opposite to the active layer in the disordered region across the first second-clad layer, the optical waveguide extending in a resonator lengthwise direction; wherein, if λ dpl is assumed to denote in nm the wavelength of photo luminescence generated by application of pumped light to the disordered region and λ apl to represent in nm the wavelength of photo luminescence generated by application of pumped light to the active layer, and if a blue shift amount λ bl in nm is defined as equal to λ apl−λ dpl then the blue shift amount λ bl meets a condition of λ bl≧20.

Accordingly, when the active layer is disordered so as to constitute the window layer, the semiconductor laser is considered to have acquired an improved COD level. This makes it possible to fabricate semiconductor laser devices with consistently and appreciably limited variations of immunity from COD degradation.

Another object of the invention is to provide a method in simplified steps for fabricating at high yield rates a semiconductor laser device offering an appreciably consistent immunity from COD degradation.

According to another aspect of the invention, there is provided a semiconductor laser device fabricating method including the steps of: firstly forming a first clad layer of a first conductivity type, an active layer of a quantum well structure, and a first second-clad layer successively on a semiconductor substrate of the first conductivity type; secondly forming on a surface of the first second-clad layer a mask pattern for impurity implantation having an opening in a region where a resonator facet of a semiconductor laser device is expected to be formed; thirdly disordering the active layer near the resonator facet by introducing impurities with the mask pattern used as a mask; fourthly applying pumped light to the disordered region to generate photo luminescence therefrom, and measuring a wavelength of the photo luminescence as a basis for predicting a level of COD degradation; fifthly forming a second second-clad layer of the second conductivity type on the surface of the first second-clad layer after removing the mask pattern for impurity implantation; sixthly forming on a surface of the second second-clad layer a stripe-shaped mask pattern in a manner opposed to the disordered active layer across the first and the second second-clad layer, the stripe-shaped mask pattern extending in a resonator lengthwise direction; and seventhly forming an optical waveguide including the second second-clad layer with the stripe-shaped mask pattern used as a mask.

Accordingly, the inventive method allows levels of COD degradation to be predicted halfway through the process of semiconductor laser fabrication. This permits high-yield, low-cost fabrication of semiconductor laser devices in simplified steps.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, substantially the same elements are given the same reference numbers.

DESCRIPTION OF THE PREFERRED EMBODIMENT

A semiconductor laser having an oscillation wavelength of 770 to 810 nm according to the invention has its COD levels predicted illustratively as follows. Impurities are introduced (i.e., implanted or diffused) into the MQW active layer near the light emitting facet of the semiconductor laser to form disordered regions constituting a window layer. Pumped light is emitted to the window layer to have it produce photo luminescence whose wavelength $\lambda$ dpl (nm) is measured. A blue shift amount $\lambda$ bl (nm) is defined as the difference between the wavelength $\lambda$ apl (nm) of photo luminescence generated by application of pumped light to the active layer without a window layer on the one hand, and the wavelength $\lambda$ dpl (nm) of photo luminescence from the window layer on the other hand. The blue shift amount $\lambda$ bl is referenced during the process in order to predict COD levels of the end product.

Figure 1:
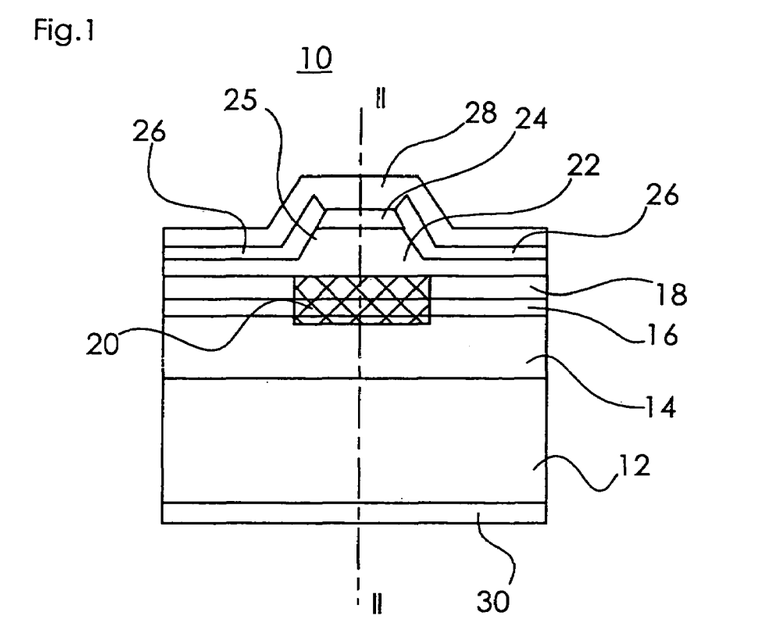
FIG. 1 is a front view of a light emitting facet of a semiconductor laser in accordance with one embodiment of the invention.
Figure 2:
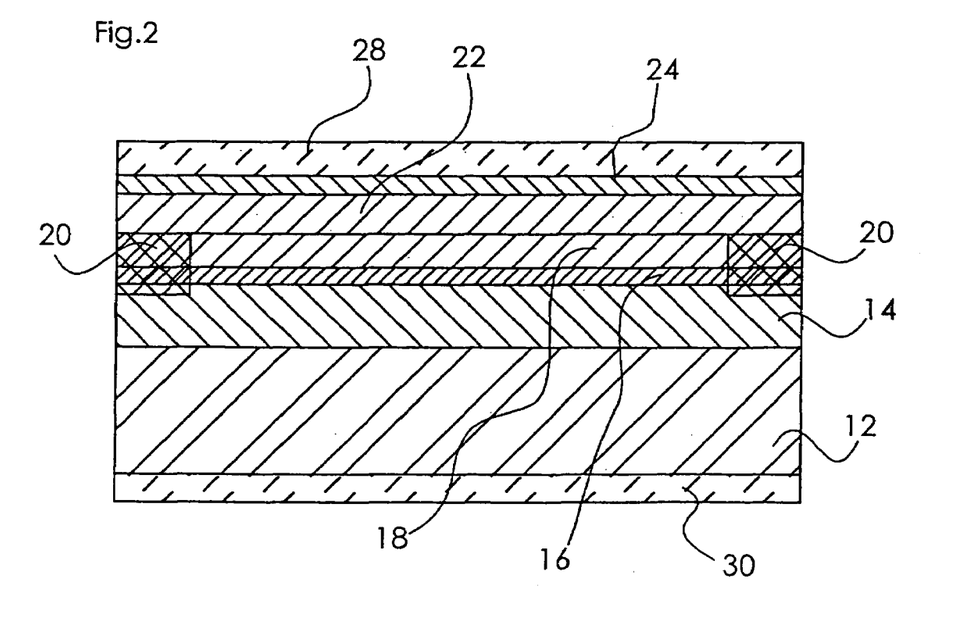
FIG. 2 is a cross sectional view of the semiconductor laser taken on line II—II in FIG. 1.

FIG. 1 is a front view of a light emitting facet of a semiconductor laser embodying the invention. FIG. 2 is a cross sectional view of the semiconductor laser taken on line II—II in FIG. 1.

In FIGS. 1 and 2, reference numeral 10 stands for a semiconductor laser having an oscillation wavelength of 770 to 810 nm; 12 for an n-GaAs substrate; 14 for an n-$Al_{0.5}Ga_{0.5}As$ lower clad layer as a first clad layer disposed on the n-GaAs substrate 12; 16 for an MQW active layer which is disposed on the lower clad layer 14 and which comprises an i-$Al_{0.1}Ga_{0.5}As$ well layer as well as $Al_{0.3}Ga_{0.5}As$ barrier and guide layers; and 18 for a p-$Al_{0.5}Ga_{0.5}As$ first upper clad layer as one second-clad layer disposed on the MQW active layer.

Reference numeral 20 denotes a disordered region constituting a window layer disposed in a light emitting region in the vicinity of a resonator facet of the semiconductor laser 10. This is a region with its band gap widened when impurities are introduced by ion implantation or diffusion from the surface of the first upper clad layer 18 so as to get the MQW active layer disordered. Thus constituted, the region stays transparent to laser emissions.

More specifically, when the well layer, barrier layer and guide layer making up the original MQW active layer 16 are disordered, an Al composition ratio of the well layer becomes greater than that of the original well layer. That in turn increases the band gap.

Reference numeral 22 denotes a p-$Al_{0.5}Ga_{0.5}As$ second upper clad layer as another second clad layer disposed on the first upper clad layer 18 and window layer 20. Numeral 24 represents a p-GaAs contact layer disposed on the second upper clad layer 22. The second upper clad layer 22 and contact layer 24 make up a ridge 25 as a waveguide in the optical waveguide direction. The contact layer 24 is formed at the top of the ridge 25.

Reference numeral 26 stands for an insulating film such as an SiON film which blocks currents and which is formed on the surface of the second upper clad layer 22 on both sides of the ridge 25 and in its vicinity. Numeral 28 denotes a p-type electrode disposed on the surface of the semiconductor laser, and numeral 30 represents an n-type electrode disposed on the back of the n-GaAs substrate 12.

Figure 5:
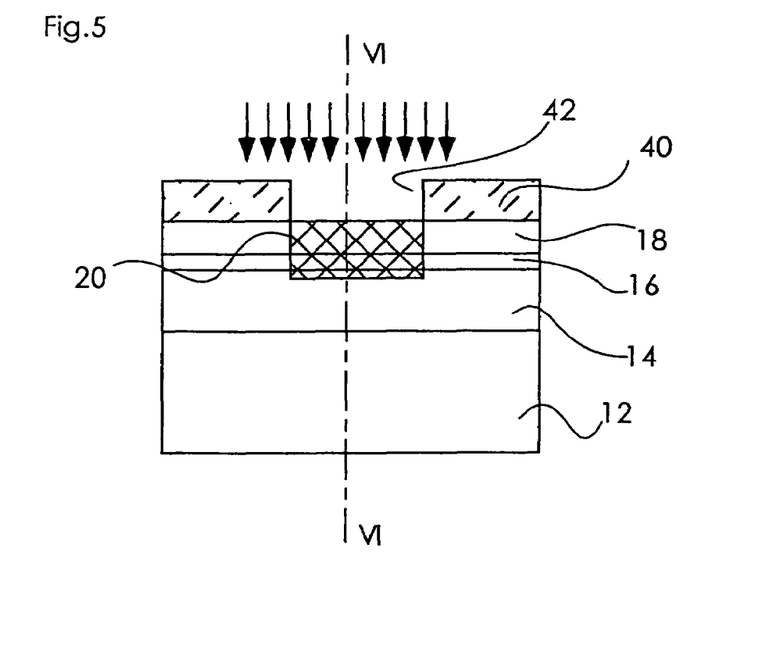
FIG. 5 is a front view of the light emitting facet of the semiconductor laser in another step of fabricating a semiconductor laser in accordance with one embodiment of the invention.
Figure 6:
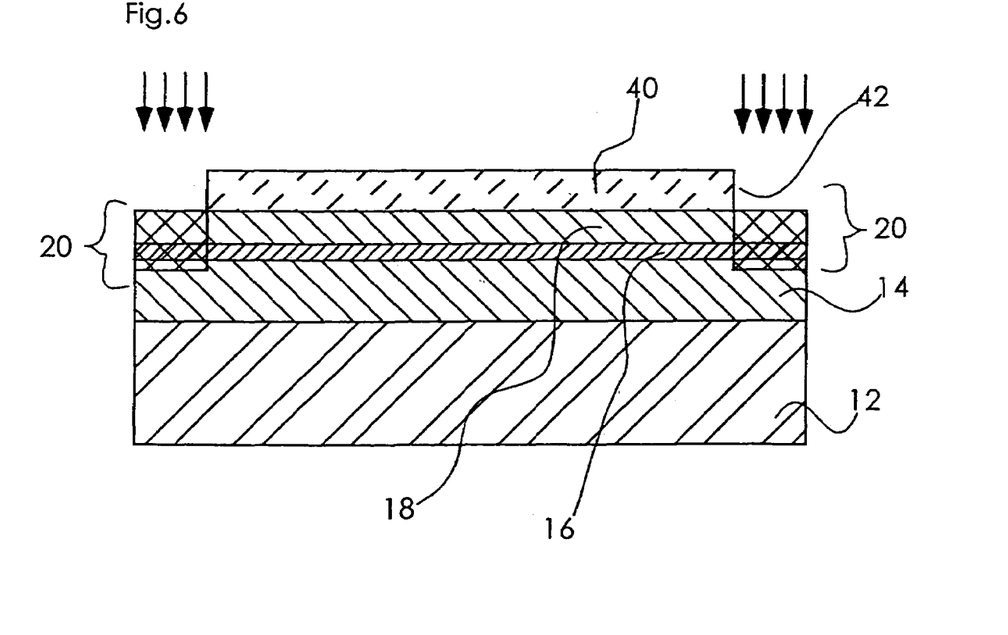
FIG. 6 is a cross sectional view taken an line VI—VI in FIG. 5.
Figure 7:
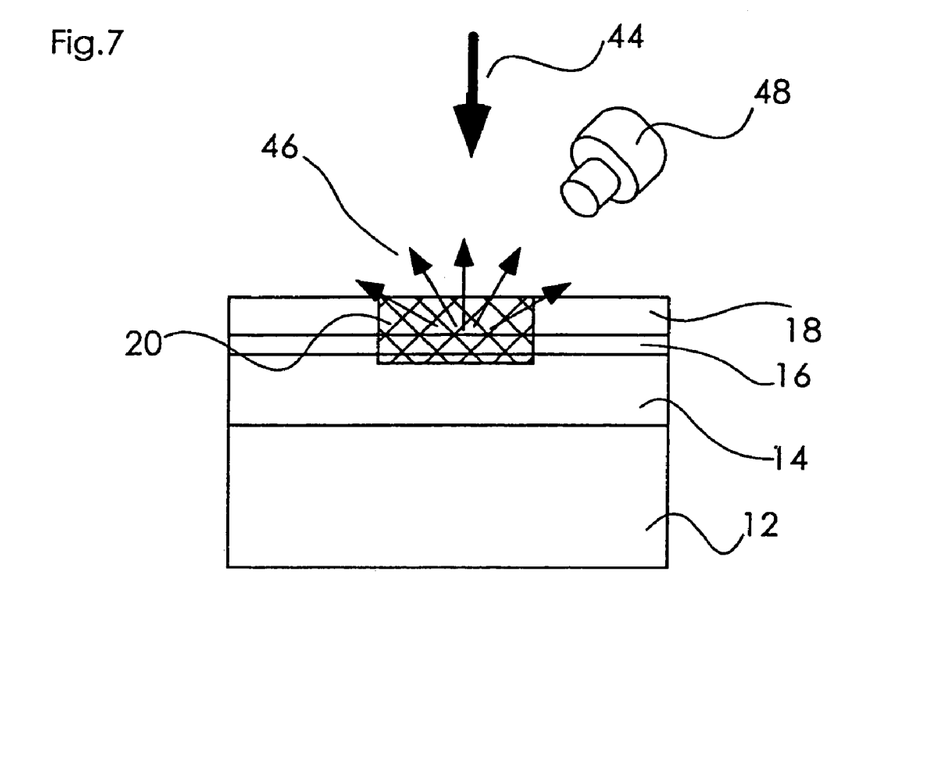
FIG. 7 is a schematic view showing illustratively how photo luminescence of a semiconductor laser in accordance with one embodiment of the invention is measured.
Figure 8:
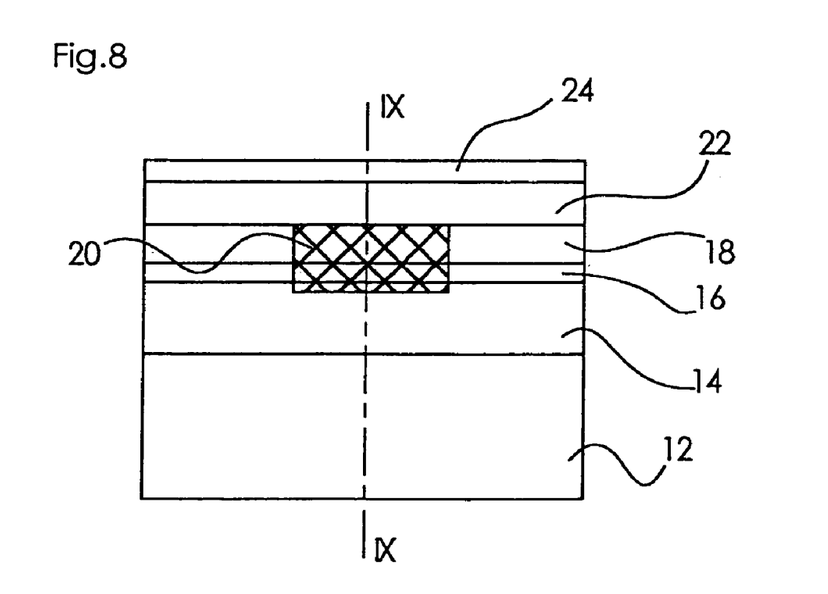
FIG. 8 is a front view of the light emitting facet of the semiconductor laser in another step of fabricating a semiconductor laser in accordance with one embodiment of the invention.
Figure 9:
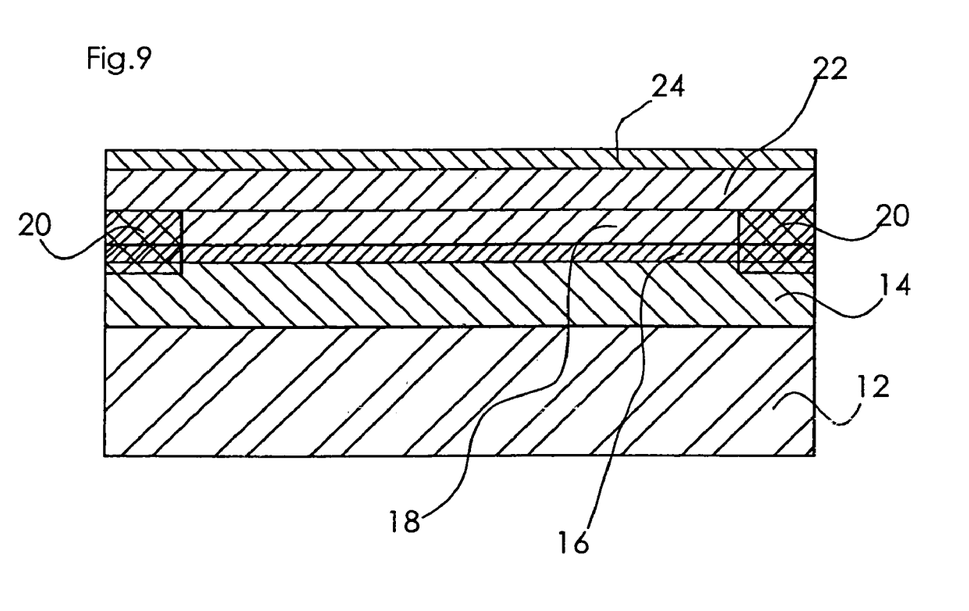
FIG. 9 is a cross sectional view taken on line IX—IX in FIG. 8.
Figure 10:
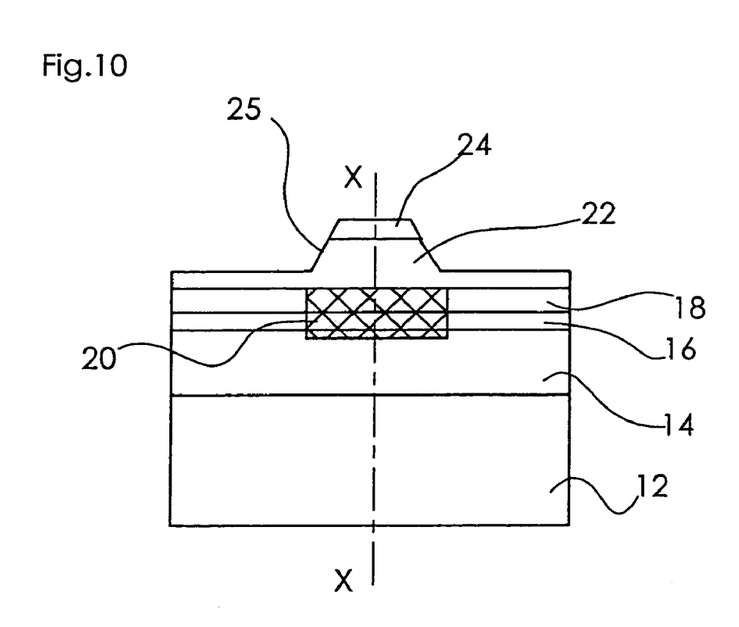
FIG. 10 is a front view of the light emitting facet of the semiconductor laser in another step of fabricating a semiconductor laser in accordance with one embodiment of the invention.
Figure 11:
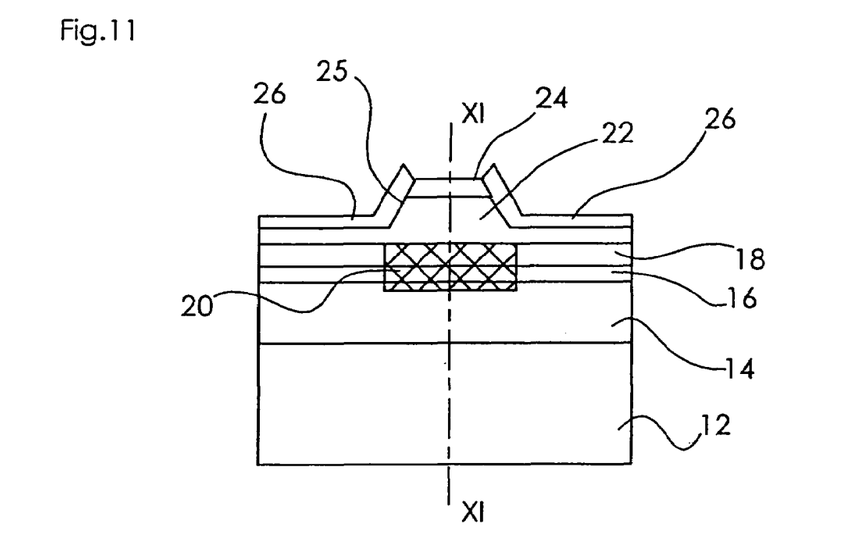
FIG. 11 is a front view of the light emitting facet of the semiconductor laser in another step of fabricating a semiconductor laser in accordance with one embodiment of the invention.

A semiconductor laser fabricating method embodying the invention will now be described. FIGS. 3, 5, 8, 10 and 11 are front views of the light emitting facet of the inventive semiconductor laser in different step of the inventive fabricating method. FIG. 4 is a cross sectional view taken online IV—IV in FIG. 3; FIG. 6 is a cross sectional view taken on line VI—VI in FIG. 5; and FIG. 9 is a cross sectional view taken on line IX—IX in FIG. 8. Cross sectional views taken on line X—X in FIG. 10 and on line XI—XI in FIG. 11 are the same as that in FIG. 9. FIG. 7 is a schematic view showing how photo luminescence of the inventive semiconductor laser is illustratively measured.

Figure 3:
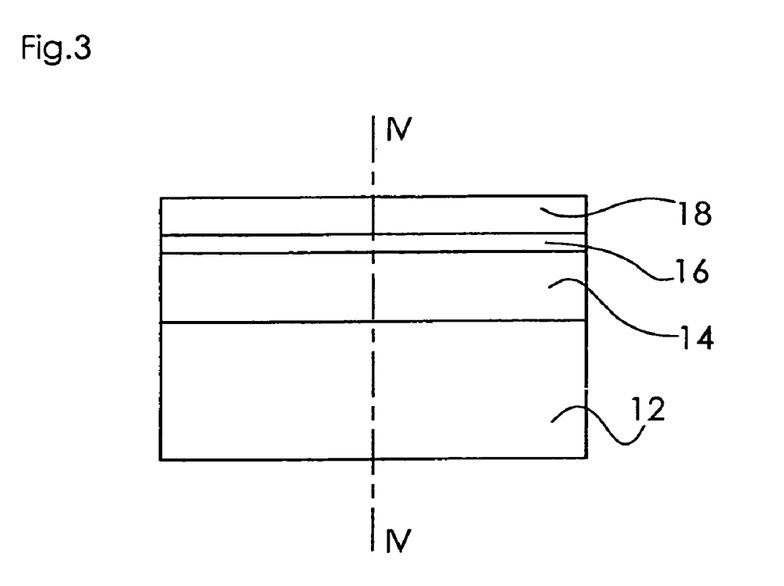
FIG. 3 is a front view of the light emitting facet of the semiconductor laser in one step of fabricating a semiconductor laser in accordance with one embodiment of the invention.
Figure 4:
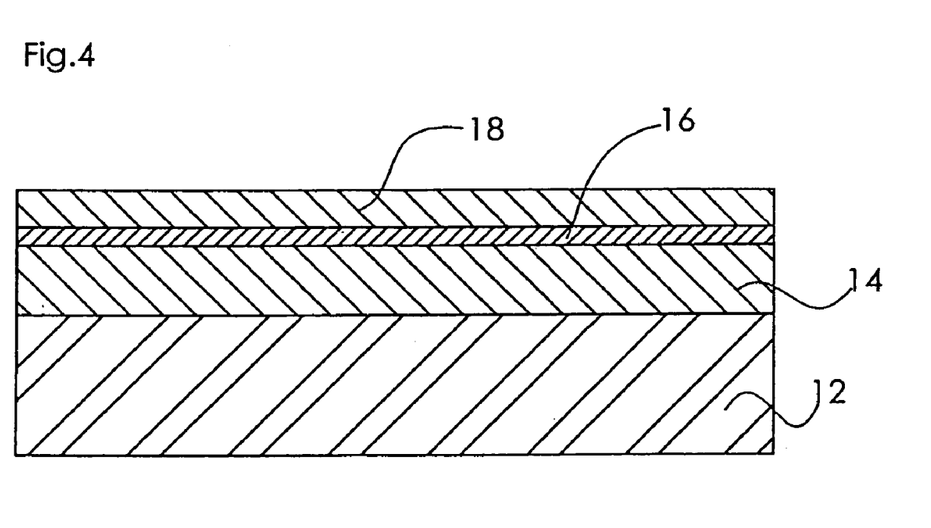
FIG. 4 is a cross sectional view taken on line IV—IV in FIG. 3.

Referring first to FIGS. 3 and 4, the lower clad layer 14, MQW active layer 16, and first upper clad layer 18 are epitaxially grown on the n-GaAs substrate 12. Referring to FIGS. 5 and 6, a resist is formed on the surface of the first upper clad layer 18. A mask pattern 40 is formed together with an opening 42 for constituting the window layer 20 at the laser resonator facet. Impurities are introduced from above the mask pattern 40 through the opening by diffusion or ion implantation. Annealing is carried out to disorder the MQW active layer 16 to form the window layer 20. Arrows in FIGS. 5 and 6 indicate the direction in which diffusion or ion implantation is carried out. Ion implantation, if adopted, is executed at an acceleration voltage of 50 keV to 150 keV with a dose of about $1\times10^{13}$ to $1\times10^{15}/cm^2$.

The resist 40 is removed, and the wafer is annealed in order to disorder the MQW 16. After the annealing, pumped light is applied from above the wafer so that photo luminescence from the window layer 20 is measured. FIG. 7 shows how photo luminescence is illustratively measured. In FIG. 7, reference numeral 44 stands for pumped light; 46 for photo luminescence emitted from the window layer 20; and 48 for a measuring instrument that measures levels of photo luminescence.

After the measurement, the second upper clad layer 22 is formed on the first upper clad layer 18 and window layer 20. The contact layer 24 is disposed on the second upper cad layer 22. FIGS. 8 and 9 depict how the layers are formed.

A stripe-shaped resist pattern (not shown) such as a resist is, then formed in the resonator lengthwise direction of the light emitting region. With the resist pattern used as a mask, etching is carried out to shave the second upper clad layer 22 to a predetermined thickness, thereby forming the ridge 25. FIG. 10 shows how this step is performed.

The top of the ridge 25 is then truncated. Insulating films 26 are formed along both sides of the ridge 25 and over the second upper clad layer 22 around the ridge 25. The insulating films 26 are provided so as to block currents. FIG. 11 depicts how this step is done.

Thereafter, the p-type electrode 28 is formed on the contact layer 24 and insulating films 26 at the top of the ridge 25. The back of the n-GaAs substrate 12 is ground to about 100 μm, whereby the n-type electrode 30 is formed at the substrate back. Finally, cleaving is carried out to complete the semiconductor laser as shown in FIGS. 1 and 2.

The window structure laser formed by the above-described sequence of steps is characterized in that the window layer and electrode are formed during the wafer process. Compared with conventional semiconductor lasers with their window layer formed after cleaving, the inventive semiconductor laser is easy to mass-produce.

Below is a description of how to measure photo luminescence (called PL hereunder) emitted from the window layer 20 upon irradiation of pumped light from above the wafer.

Figure 12:
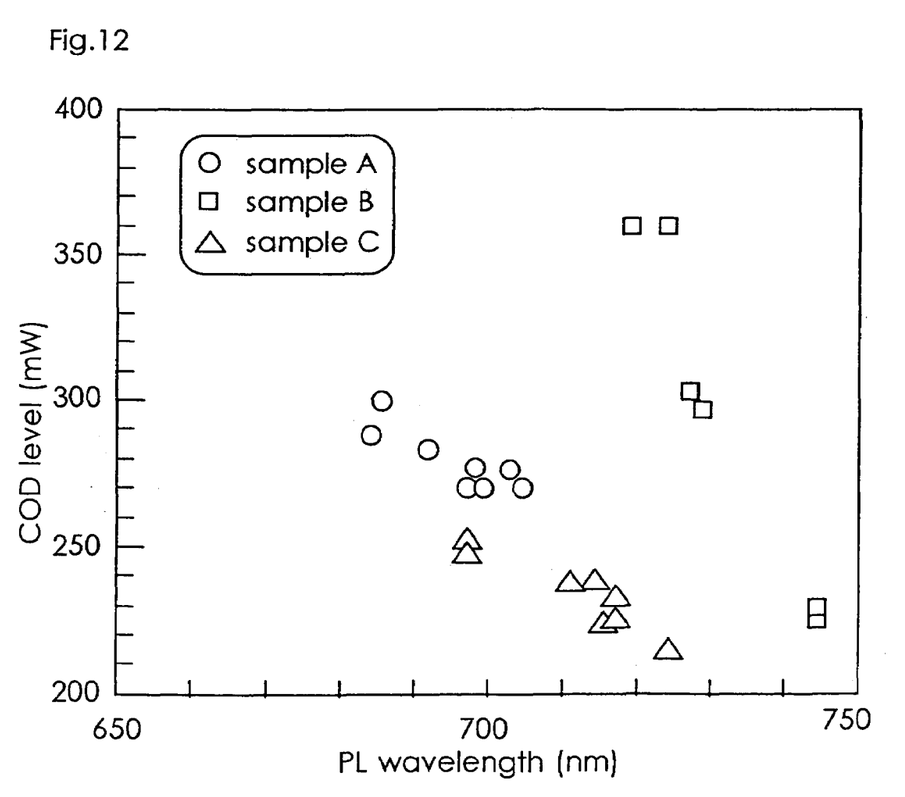
FIG. 12 is a graphic representation of relations between photo luminescence wavelengths (nm) of the window layer in a semiconductor laser in accordance with one embodiment of the invention on the one hand, and COD levels (mW) of the semiconductor laser on the other hand.

FIG. 12 is a graphic representation of relations between PL wavelengths (nm) of the window layer 20 in the inventive semiconductor laser on the one hand, and COD levels (mW) of the semiconductor laser on the other hand. In other words, FIG. 12 shows relations between levels of the optical output destroying the light emitting facet of the semiconductor laser on the one hand, and PL wavelengths stemming from the semiconductor laser window layer on the other hand.

Samples A, B and C represent semiconductor lasers of the same structure but fabricated under partially different conditions. In each group of samples of the same type, as illustrated in FIG. 12, the shorter the PL wavelength, the higher the COD level. Why the COD level tends to be higher the shorter the PL wavelength is because less light is absorbed near the resonator facet as the band gap becomes greater in keeping with higher degrees of disorder in the window layer.

In FIG. 12, the COD level is assumed to be represented by Pcod (mW) and the PL wavelength of the window region by λ dpl (nm). Pcod is linearly proportional to λ dpl. That is, $$Pcod = f1(\lambda\, dpl) \quad (1)$$

where, f1(x) is a linear function.

With this semiconductor laser, λ dpl is also linearly proportional to Pcod, so that the following equation is readily derived from the equation (1) above:

$$\lambda dpl = g1(Pcod) \quad (2)$$

If Pcod is defined as a value made of a required laser output P0 and a power margin P1, then $$Pcod = P0 + P1 \quad (3)$$

In that case, the PL wavelength identifying the semiconductor laser having Pcod is obtained as λ dpl. With this value used as a reference, the semiconductor laser can be checked for compliance with COD level requirements just after the window layer 20 is formed. That is, when the PL wavelength λ dpl (nm) of the window layer 20 is measured, it is possible consistently to produce semiconductor lasers of high reliability at high yield rates, with the presence of the window layer 20 working against COD degradation.

Semiconductor lasers with no window layer and having the same structure as those discussed in connection with FIG. 12 are known to have the COD level of about 200 mW. As shown in FIG. 12, the PL wavelength is 750 nm or less when the COD level is 200 mW or higher.

It follows that if semiconductor lasers have an MQW active layer with oscillation wavelengths of 770 to 810 nm and if they have a window layer 20 such that the PL wavelength is 750 nm or less, then these semiconductor lasers turn out to have improved COD levels at least thanks to the effect of the window layer 20.

Figure 13:
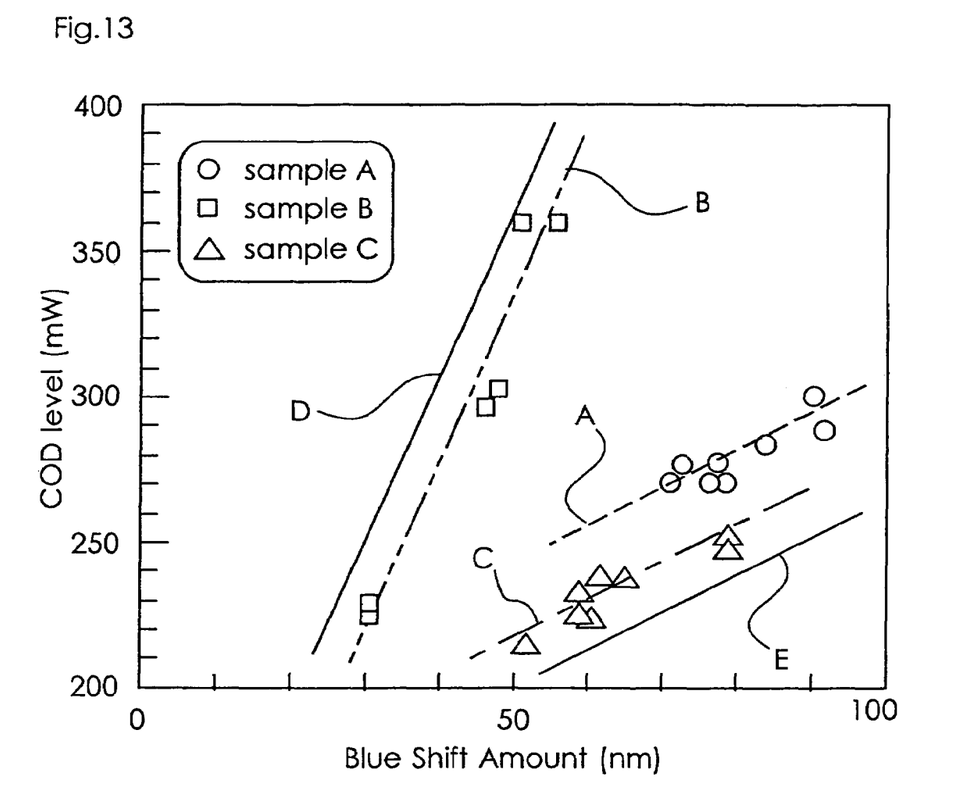
FIG. 13 is a graphic representation of relations between COD levels of a semiconductor laser in accordance with one embodiment of the invention on the one hand and its blue shift amount on the other hand.

FIG. 13 is a graphic representation of relations between COD levels of the inventive semiconductor laser on the one hand and its blue shift amount on the other hand.

The blue shift amount λ bl (nm) is defined here as the difference between the wavelength λ apl (nm) of photo luminescence (PL) generated by application of pumped light to an active layer yet to be disordered on the one hand, and the wavelength λ dpl (nm) of photo luminescence from the window layer 20 on the other hand. Given the definition, the relations in FIG. 12 are rearranged into what is shown in FIG. 13.

Since semiconductor lasers with oscillation wavelengths of 770 to 810 nm are known to have COD levels of about 200 mW in their MQW active layer with no window layer, FIG. 13 graphically shows how much the COD level of the window layer is expected to improve with regard to given blue shift amounts.

FIG. 13 shows that for samples A, B and C, the blue shift amount λ bl and the COD level Pcod are in linear relation to each other.

A straight line A (broken line in FIG. 13) representing samples A is plotted when $$Pcod=1.3\lambda bl+178.7 \quad (4)$$

A straight line B (two-dot chain line) representing samples B is provided when $$Pcod=5.6\lambda bl+50.3 \quad (5)$$

A straight line C (dashed line) representing samples C is drawn when $$Pcod=1.3\lambda bl+153.0 \quad (6)$$

A straight line D shown on the left-hand side of the straight line B is formed when $$Pcod=5.6\lambda bl+85 \quad (7)$$

A straight line E indicated on the right-hand side of the straight line C is given when $$Pcod=1.3\lambda bl+135 \quad (8)$$

In FIG. 13, the points of measurement are shown distributed in an area enclosed by, the straight lines D and E, covering widely scattered points as well.

It can be seen that semiconductor lasers with their Pcod less than 200 mW have the blue shift amount λ bl of about 20 since the MQW active layer with no window region has the COD level of about 200 mW. For that reason, if the MQW active layer is disordered so as to constitute the window layer 20 where the blue shift amount λ bl is at least 20, then the COD level is considered improved.

In brief, after the MQW active layer 16 is disordered to constitute the window layer 20 in the vicinity of the resonator facet, the window layer 20 is subjected to irradiation of pumped light so that wavelengths of photo luminescence from the window layer 20 are measured. The blue shift amount λ bl is obtained by taking into account the PL wavelength of the MQW active layer with no window region. If the blue shift amount λ bl, turns out to be 20 or greater, it can be concluded that the COD level is improved at least by formation of the window layer 20.

In the region of FIG. 13 enclosed by the straight lines D and E, the blue shift amount λ bl and the COD level Pcod are considered to be in linearly proportional relation even regarding different samples fabricated under different conditions.

For semiconductor lasers at least with oscillation wavelengths of 770 to 810 nm and fabricated under different conditions, it is thus important to establish the linearly proportional relation between the blue shift amount λ bl and the COD level Pcod. Before each semiconductor laser is turned into a final product and halfway through the process of producing the window layer 20 by disordering the MQW active layer 16 near the resonator facet, pumped light is applied to the window layer 20 so that the wavelength of photo luminescence from the window layer 20 is measured. When the blue shift amount λ bl is obtained by taking into account the PL wavelength of the MQW active layer yet to be disordered, it is possible to predict the COD level Pcod of the end product.

When the blue shift amount λ bl is defined, in terms of Pcod based on the equations (7) and (8) above, as a value meeting the condition of $$(Pcod-85)/5.6 \leq \lambda bl \leq (Pcod-0.135.0)/1.3$$

then establishing the linearly proportional relation between the blue shift amount λ bl and the COD level Pcod allows the COD level Pcod to be predicted with a high degree of accuracy. This in turn makes it possible to fabricate highly reliable semiconductor lasers with consistently and appreciably limited variations of COD degradation. By allowing COD degradation levels to be predicted in simplified steps halfway through the production process, the inventive method permits high-yield, low-cost fabrication of dependable semiconductor lasers at consistently low levels of COD degradation.

The features and the advantages of the present invention as described above may be summarized as follows.

According to one aspect of the invention, there is provided a semiconductor laser device with an oscillation wavelength of 770 to 810 nm, comprising: a semiconductor substrate of a first conductivity type; a first clad layer of the first conductivity type disposed on the semiconductor substrate; an active layer of a quantum well structure disposed on the first clad layer; a first second-clad layer of a second conductivity type disposed on the active layer; a disordered region formed near a laser resonator facet by introducing impurities from a surface of the first second-clad layer into the layers including the active layer on the semiconductor substrate; and an optical waveguide including a second second-clad layer of the second conductivity type disposed on the surface of the first second-clad layer in a manner opposite to the active layer in the disordered region across the first second-clad layer, the optical waveguide extending in a resonator lengthwise direction; wherein if λ dpl is assumed to denote in nm the wavelength of photo luminescence generated by application of pumped light to the disordered region and λ apl to represent in nm the wavelength of photo luminescence generated by application of pumped light to the active layer, and if a blue shift amount λ bl in nm is defined as equal to λ apl−λ dpl, then the blue shift amount λ bl meets a condition of λ bl≧20. When the active layer is disordered so as to constitute the window layer, the semiconductor laser is considered to have acquired an improved COD level. This makes it possible to fabricate semiconductor laser devices with consistently and appreciably limited variations of immunity from COD degradation.

In one preferred structure according to the invention, if Pcod is assumed to demote in mW a COD level of the laser device, then the blue shift amount λ bl in nm further may meet a condition of (Pcod−85)/5.6≦λbl≦(Pcod−135.0)/1.3. With this structure, obtaining the blue shift amount λ bl allows the COD level Pcod of the end product to be predicted. This makes it possible to fabricate semiconductor laser devices at low cost with enhanced immunity from COD degradation.

In another preferred structure according to the invention, the semiconductor laser device may further comprise insulating films disposed on the first second-clad layer and on sides of the optical waveguide but not over a top portion of the optical waveguide. Disordering the active layer to form the window layer in the semiconductor laser of a simple stripe structure makes up a semiconductor laser device with an improved COD level. This permits fabrication of semiconductor laser devices of the simple stripe structure with consistently and significantly limited variations of immunity from COD degradation.

In a further preferred structure according to the invention, the semiconductor laser device may further comprise a current blocking layer of the first conductivity type disposed so as to bury the optical waveguide on the first second-clad layer. Disordering the active layer to form the window layer in the semiconductor laser of a buried structure also constitutes a semiconductor laser device with an improved COD level. This permits fabrication of semiconductor laser devices of the buried structure with consistently and considerably limited variations: of immunity from COD degradation.

According to another aspect of the invention, there is provided a semiconductor laser device fabricating method including the steps of: firstly forming a first clad layer of a first conductivity type, an active layer of a quantum well structure, and a first second-clad layer successively on a semiconductor substrate of the first conductivity type; secondly forming on a surface of the first second-clad layer a mask pattern for impurity implantation having an opening in a region where a resonator facet of a semiconductor laser device is expected to be formed thirdly disordering the active layer near, the resonator facet by introducing impurities with the mask pattern used as a mask; fourthly applying pumped light to the disordered region to generate photo luminescence therefrom, and measuring a wavelength of the photo luminescence as a basis for predicting a level of COD degradation; fifthly forming a second second-clad layer of the second conductivity type on the surface of the first second-clad layer after removing the mask pattern for impurity implantation; sixthly forming on a surface of the second second-clad layer a stripe-shaped mask pattern in a manner opposed to the disordered active layer across the first and the second second-clad layer, the stripe-shaped mask pattern extending in a resonator lengthwise direction; and seventhly forming an optical waveguide including the second second-clad layer with the stripe-shaped mask pattern used as a mask. The inventive method allows levels of COD degradation to be predicted halfway through the process of semiconductor laser fabrication. This permits high-yield, low-cost fabrication of semiconductor laser devices in simplified steps.

In one preferred variation of the inventive semiconductor laser device fabricating method, if the semiconductor laser device has an oscillation wavelength of 770 to 810 nm; if $\lambda$ dpl is assumed to denote in nm the wavelength of photo luminescence generated by application of pumped light to the disordered region and $\lambda$ apl to represent in nm the wavelength of photo luminescence generated by application of pumped light to the active layer; and if a blue shift amount $\lambda$ bl in nm is defined as equal to $\lambda$ apl–$\lambda$dpl, then the blue shift amount $\lambda$ bl may meet a condition of $\lambda$bl$\geq$20 when the fourth step is carried out. Disordering the active layer to form the window layer in the semiconductor laser with the oscillation wavelength of 770 to 810 nm makes up a semiconductor laser device with an improved COD level. This permits high-yield, low-cost fabrication of semiconductor laser devices with consistently and significantly limited variations of immunity from COD degradation.

In another preferred variation of the inventive semiconductor laser device fabricating method, if Pcod is assumed to denote in mW a COD level of the laser device, then the blue shift amount $\lambda$ bl in nm may further meet a condition of $(Pcod-85)/5.6 \leq \lambda bl \leq (Pcod-135.0)/1.3$. The preferred method allows levels of COD degradation of end products to be predicted. This permits high-yield, low-cost fabrication of semiconductor laser devices with enhanced immunity from COD degradation.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A semiconductor laser device fabricating method including:

forming a first cladding layer of a first conductivity type, an active layer having a quantum well structure, and a first second cladding layer of a second conductivity type successively on a semiconductor substrate of the first conductivity type;

forming on the first second cladding layer a mask pattern for impurity implantation, having an opening in a region where a resonator facet of a semiconductor laser device is to be formed;

disordering a region of the active layer near the resonator facet by introducing impurities using the mask pattern as a mask;

applying pump light to the disordered region and to a non-disordered region of the active layer to generate photoluminescence therefrom, measuring wavelengths of the photoluminescence from the disordered region and from the non-disordered region, and predicting a catastrophic optical damage (COD) power level that the laser device, when completed, can withstand based on a blue shift between the wavelengths of the photoluminescence from the disordered region and the non-disordered region;

forming a second second cladding layer of the second conductivity type on said first second cladding layer, after removing the mask pattern;

forming on said second second cladding layer a stripe-shaped mask pattern, opposed to the disordered region of the active layer, and extending across the first and second second cladding layers, the stripe-shaped mask pattern extending in a resonator lengthwise direction; and forming an optical waveguide including the second second cladding layer with the stripe-shaped mask pattern used as a mask, wherein the semiconductor laser device produces light having a wavelength in the range of 770 to 810 nm, $\lambda$ dpl denotes, in nm, the wavelength of photoluminescence generated by application of pump light to the disordered region of the active layer, $\lambda$ apl represents, in nm, the wavelength of photoluminescence generated by application of pump light to the non-disordered region of the active layer, and $\lambda$ bl, in nm, is equal to $\lambda$ apl–$\lambda$ dpl, including determining that the COD power level that the laser device, when completed, can withstand has been increased when $\lambda$ bl>20.

2. The semiconductor laser device fabricating method according to claim 1 wherein, when Pcod denotes, in mW, the COD power level that the laser device can withstand, $$(Pcod-85)/5.6 \leq \lambda\ bl \leq (Pcod-135.0)/1.3.$$

* * * * *